United States Patent [19]

Iwahashi et al.

[11] Patent Number: 4,593,203
[45] Date of Patent: Jun. 3, 1986

[54] SEMICONDUCTOR INTEGRATED CIRCUIT WHICH ALLOWS ADJUSTMENT OF CIRCUIT CHARACTERISTICS IN ACCORDANCE WITH STORAGE DATA OF NONVOLATILE MEMORY ELEMENT

[75] Inventors: Hiroshi Iwahashi, Yokohama; Masamichi Asano, Tokyo, both of Japan

[73] Assignee: Tokyo Shibaura Denki Kabushiki Kaisha, Kawasaki, Japan

[21] Appl. No.: 465,034

[22] Filed: Feb. 8, 1983

[30] Foreign Application Priority Data

Feb. 10, 1982 [JP] Japan .................................. 57-20101

[51] Int. Cl.[4] ................. H03K 19/094; H03K 19/017; H03K 5/12; H03K 19/20
[52] U.S. Cl. .................................. 307/202.1; 307/468; 307/469; 307/450; 307/263; 307/601
[58] Field of Search ....................... 307/202.1, 465, 468, 307/469, 448, 451, 263, 268, 601, 602, 605; 365/96, 103, 104; 340/825.83, 825.84

[56] References Cited

U.S. PATENT DOCUMENTS

| | | | |
|---|---|---|---|
| 4,084,105 | 4/1978 | Teranishi | 307/468 X |
| 4,417,154 | 11/1983 | Kuo | 365/96 X |
| 4,424,456 | 1/1984 | Shiraki et al. | 307/451 X |
| 4,446,534 | 5/1984 | Smith | 307/202.1 X |
| 4,464,587 | 8/1984 | Suzuki et al. | 307/451 X |
| 4,476,546 | 10/1984 | Varshney | 365/96 X |
| 4,481,432 | 11/1984 | Davies, Jr. | 307/469 |
| 4,499,387 | 2/1985 | Konishi | 307/443 |

OTHER PUBLICATIONS

ISSCC Digest of Technical Papers; pp. 80–81, "Redundancy Techniques for Fast Static RAMS," Kokkonen et al., Feb. 18, 1981.

Primary Examiner—Larry N. Anagnos
Attorney, Agent, or Firm—Finnegan, Henderson, Farabow, Garrett & Dunner

[57] ABSTRACT

The invention provides a semiconductor integrated circuit, characteristics of which can be adjusted in accordance with storage data in a nonvolatile memory element. The semiconductor integrated circuit has a main semiconductor circuit having MOS transistors, and an adjusting circuit connected to the main semiconductor circuit so as to change the circuit characteristics of the main semiconductor circuit as needed. The adjusting circuit has MOS transistors and a plurality of fuse elements. The adjusting circuit causes a given fuse element to selectively disconnect in accordance with an input signal and generates at least one adjusting signal to adjust the circuit characteristics of the main semiconductor circuit.

7 Claims, 30 Drawing Figures

F I G. 1
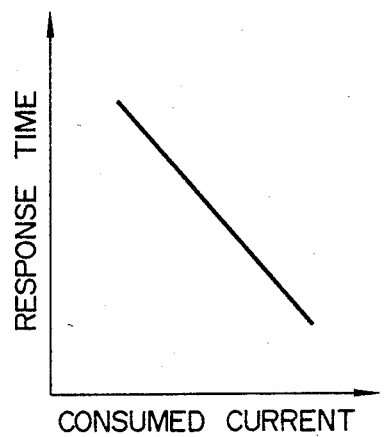
F I G. 2
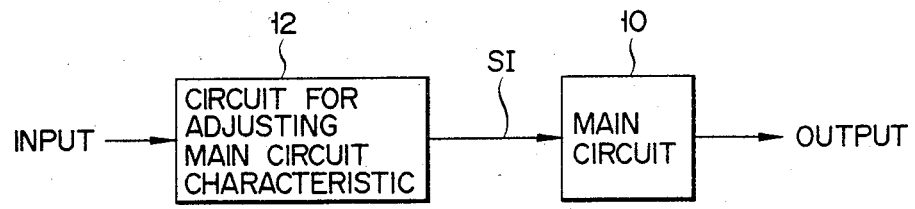

F I G. 5
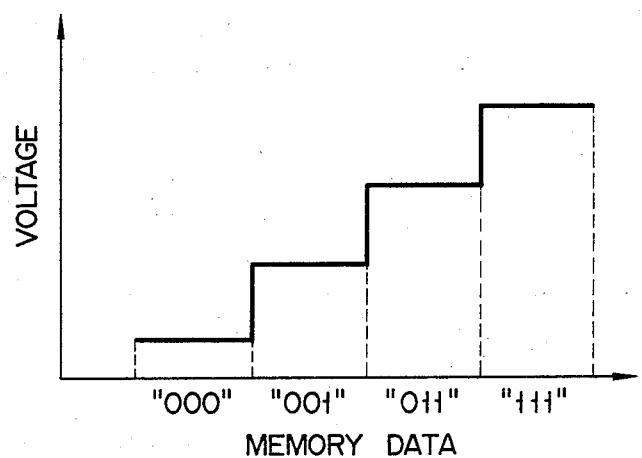
F I G. 6
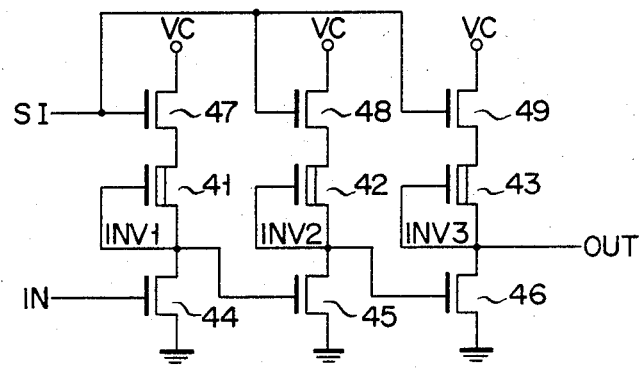

F I G. 9
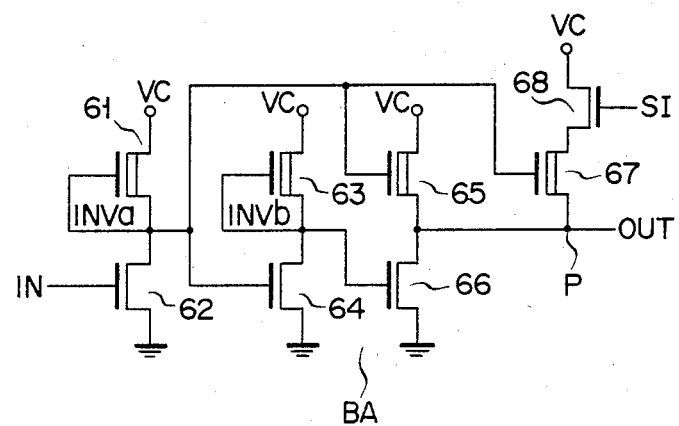
F I G. 10
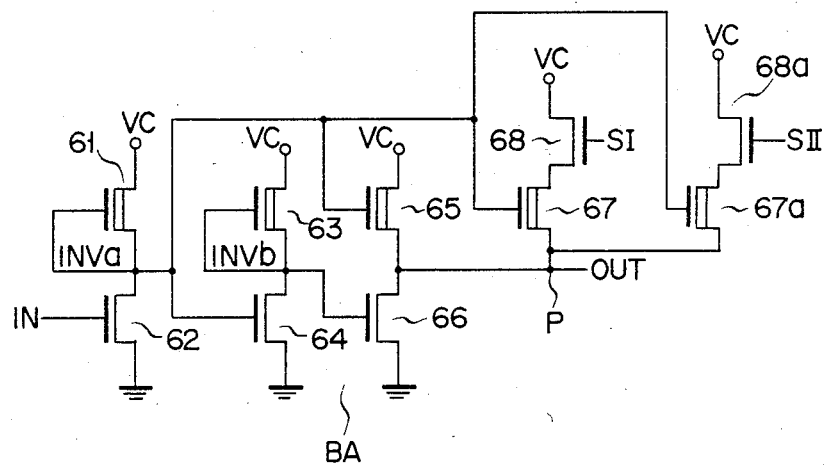

F I G. 16
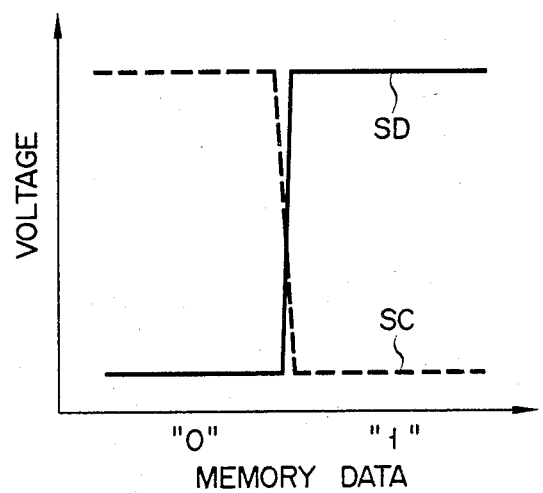

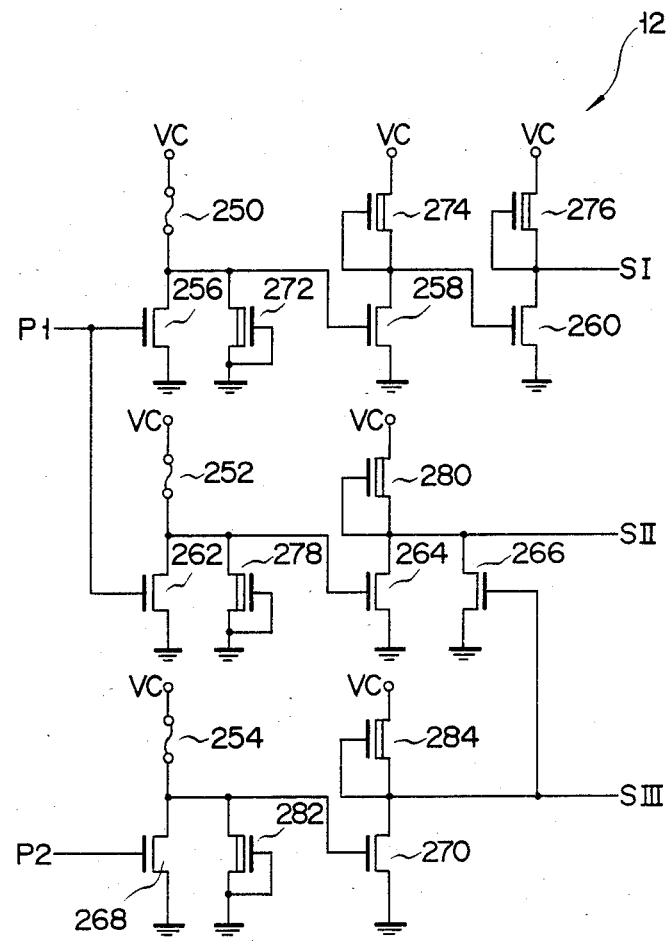
F I G. 22

F I G. 23
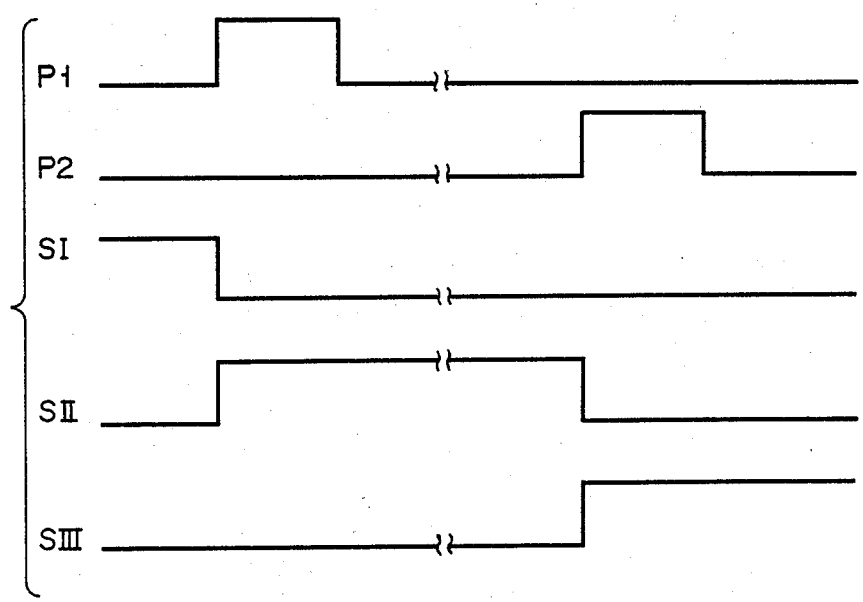
F I G. 24
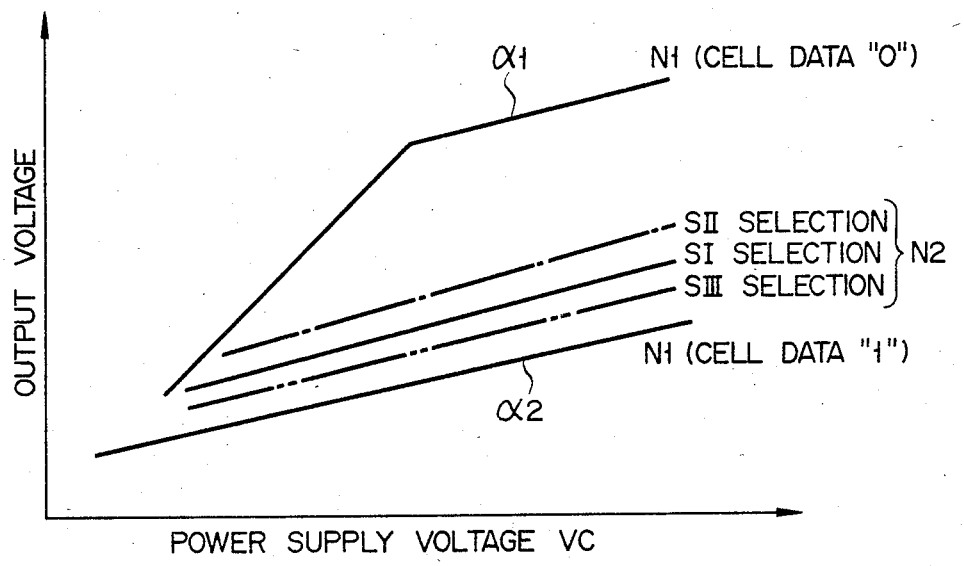

F I G. 26
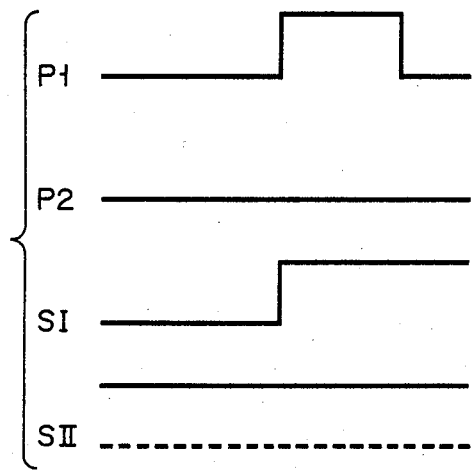
F I G. 27
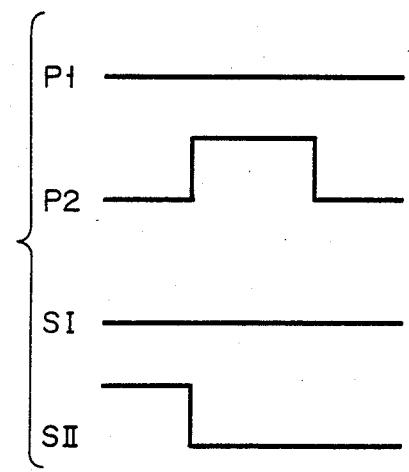
F I G. 28
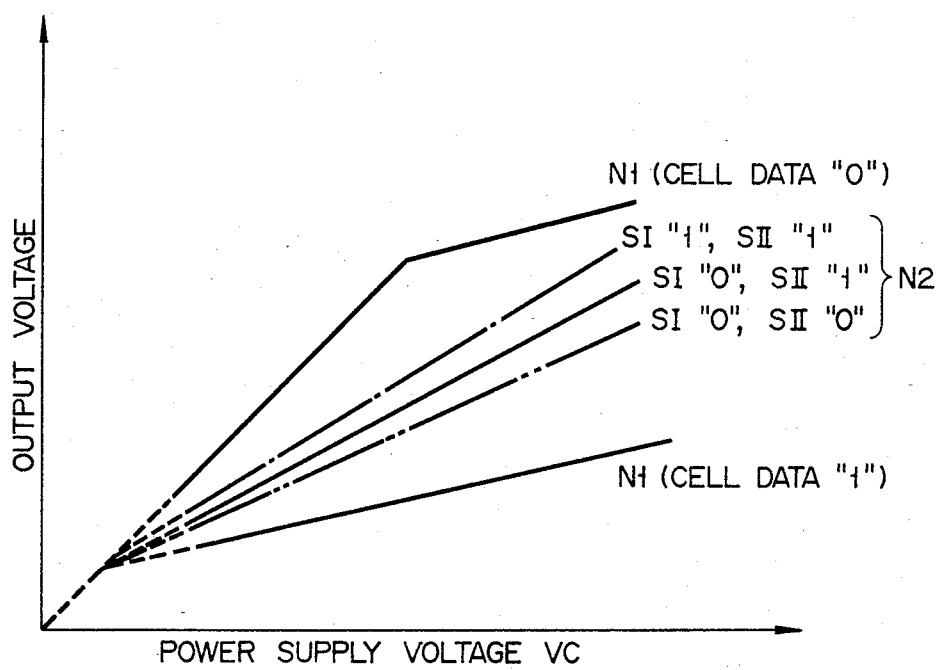

F I G. 30
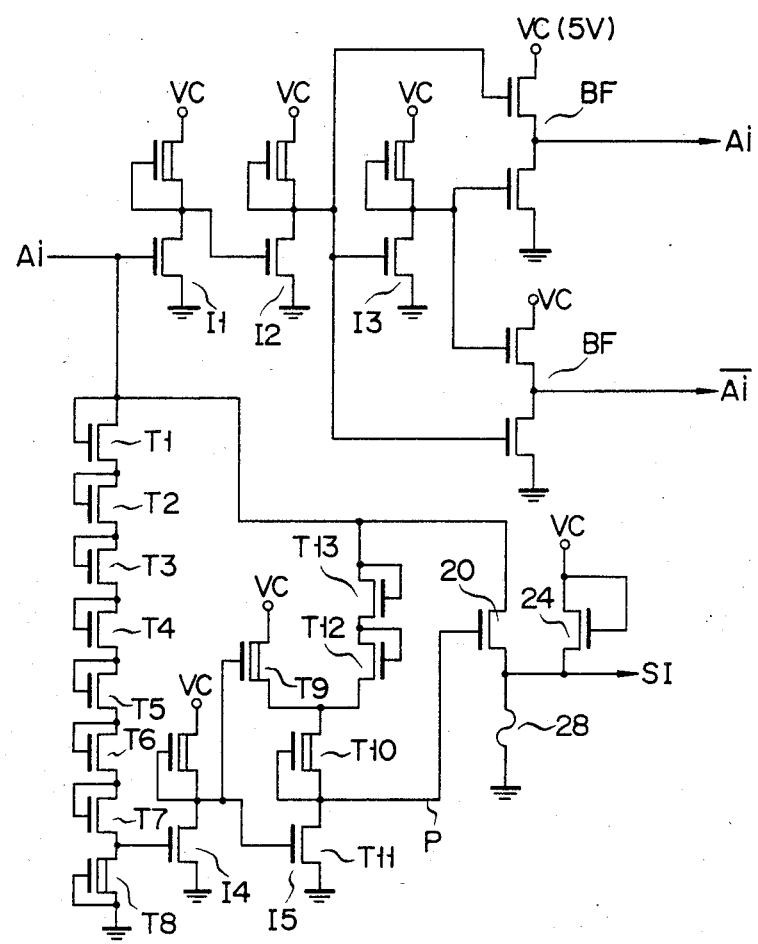

4,593,203

SEMICONDUCTOR INTEGRATED CIRCUIT WHICH ALLOWS ADJUSTMENT OF CIRCUIT CHARACTERISTICS IN ACCORDANCE WITH STORAGE DATA OF NONVOLATILE MEMORY ELEMENT

BACKGROUND OF THE INVENTION

The present invention relates to a semiconductor integrated circuit and, more particularly, to a semiconductor integrated circuit which allows adjustment of characteristics in accordance with storage data of a nonvolatile memory element.

In a semiconductor integrated circuit, the consumed current and the response time has a relationship, as shown in FIG. 1. The consumed current must be increased to improve the response time. Specifically, the response time is shortened if charge/discharge operation of the capacitors of the integrated circuit is to be performed faster. The high-speed charge/discharge operation requires a large amount of current.

Various demands are presented by users who use different system configurations: one user may say that he wishes a high-speed semiconductor integrated circuit even if current consumption is increased; and the other user may say that he wishes a low-current consumption semiconductor integrated circuit even if the operating speed is slightly impaired. In order to satisfy these needs, the semiconductor manufacturers prepare various semiconductor integrated circuits having various current consumption and response time characteristics.

The manufacturers must expect and properly satisfy the needs in the market when they manufacture various types of semiconductor integrated circuits. If their estimation is not proper, some products will be oversupplied, and others are in short supply, resulting in inconvenience.

SUMMARY OF THE INVENTION

It is, therefore, an object of the present invention to provide a general-purpose semiconductor integrated circuit which satisfies various needs.

It is another object of the present invention to provide a semiconductor integrated circuit which is suitable for mass production in a proper quantity.

In order to achieve the above objects of the present invention, there is provided a semiconductor integrated circuit comprising a main semiconductor circuit having MOS transistors, and a circuit means connected to the main semiconductor circuit for changing the circuit characteristics of the main semiconductor circuit as needed.

The circuit means comprises MOS transistors and nonvolatile memory means, e.g. a plurality of fuse means. The circuit means generates at least one adjusting signal to adjust the circuit characteristics of the main semiconductor circuit in accordance with storage data of the nonvolatile memory means.

Since the semiconductor integrated circuit has an arrangement as described above, a circuit constant and a circuit arrangement can be changed as needed, so that the consumed current and the response time can be changed.

BRIEF DESCRIPTION OF THE DRAWINGS

Other objects and advantages will be apparent from the following description taken in conjunction with the accompanying drawings, in which:

FIG. 1 is a graph showing the response time as a function of the consumed current of a semiconductor integrated circuit;

FIG. 2 is a block diagram of a semiconductor integrated circuit for explaining the principle of the present invention;

FIG. 5 is a graph showing the voltage as a function of the memory data so as to explain the characteristics of the adjusting signal SI from the adjusting circuit shown in FIG. 4;

FIG. 6 is a circuit diagram of a semiconductor integrated circuit according to a first embodiment of the present invention, in which the main semiconductor circuit comprises an inverter;

FIG. 9 is a circuit diagram of a semiconductor integrated circuit according to a second embodiment of the present invention in which the main semiconductor circuit comprises a buffer circuit;

FIGS. 10 and 11 are circuit diagrams of semiconductor integrated circuits as modifications of the circuit shown in FIG. 9;

FIG. 16 is a graph showing the voltage as a function of the memory data so as to explain the characteristics of adjusting signals SC and SD;

FIG. 22 is a circuit diagram of a circuit for adjusting main circuit characteristics and for generating control signals SI, SII and SIII;

FIG. 23 is a timing chart of write control input signals P1 and P2 and the adjusting signals SI, SII and SIII;

FIG. 24 is a graph showing the output voltages at nodes N1 and N2 as a function of the power supply voltage VC of the circuit shown in FIG. 21;

FIGS. 26 and 27 are timing charts showing changes in adjusting signals SI and SII with respect to the write control input signals P1 and P2, respectively;

FIG. 28 is a graph showing the output voltages at the nodes N1 and N2 as a function of the power supply voltage VC of the circuit shown in FIG. 25;

FIG. 30 is a circuit diagram of still another adjusting circuit used for the semiconductor integrated circuit according to the present invention.

DETAILED DESCRIPTION OF THE PREFERRED EMBODIMENTS

A semiconductor integrated circuit according to the present invention will be described with reference to FIG. 2. The semiconductor integrated circuit according to the present invention comprises a main semiconductor circuit 10 which has MOS transistors so as to have various circuit characteristics, and a circuit 12 for adjusting main circuit characteristics and for supplying at least one adjusting signal SI to the main semiconductor circuit 10. The circuit 12 comprises MOS transistors and nonvolatile memory means, e.g. a plurality of fuse elements. A predetermined fuse element is disconnected in response to an input signal, so that the adjusting signal SI is changed. When the adjusting signal SI is supplied to the main semiconductor circuit 10, the circuit constant and circuit configuration can be changed, hence current consumption and charge/discharge time are changed.

Figure 3:
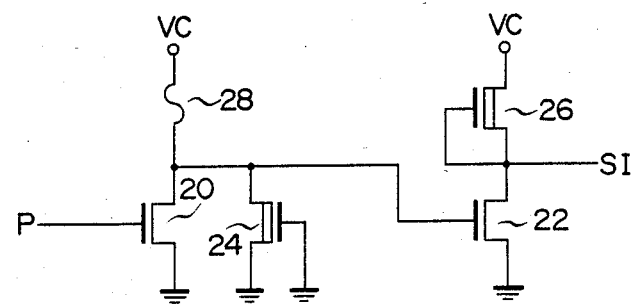
FIG. 3 is a circuit diagram of a circuit for adjusting main circuit characteristics and for producing an adjusting signal SI.

FIG. 3 shows the circuit 12 which produces the adjusting signal SI. Referring to FIG. 3, reference numerals 20 and 22 denote n-channel enhancement type transistors; 24 and 26, n-channel depletion type transistors; and 28, a nonvolatile memory element such as a poly-Si fuse element. Reference symbol P denotes a write control input. When the fuse element 28 is not disconnected, that is, when storage data is "0", the power supply voltage VC is supplied to the gate of the transistor 22 through the fuse element 28, so that the transistor 22 is ON. The drain voltage of the transistor 22 is determined by a ratio of the resistance of the transistor 22 to that of the transistor 26. However, when the write control input P goes high, the transistor 20 is ON, so that a surge current flows through the fuse element 28 which is then disconnected (i.e., data of "1" is written). In this manner, when the fuse element 28 is disconnected, the drain of the transistor 24 is set at 0 V, whereas the transistor 22 is OFF. A voltage substantially corresponding to the power supply voltage VC appears at the drain of the transistor 22 through the transistor 26. It is noted that the fuse element may be disconnected by a laser beam. In this case, the transistor 20 may be omitted, and the laser beam corresponds to the input signal P.

Figure 4:
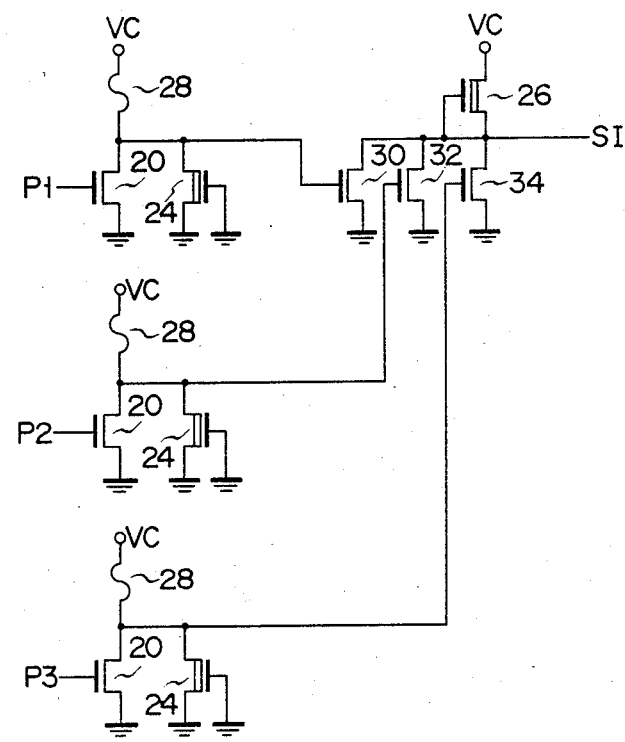
FIG. 4 is a circuit diagram of another circuit for adjusting main circuit characteristics and for producing an adjusting signal SI.

In the adjusting circuit shown in FIG. 4, three sets of the fuse element 28 and the transistors 20 and 24 shown in FIG. 3 are arranged. Transistors 30, 32 and 34 are connected parallel to each other in place of the transistor 22 shown in FIG. 3. The gates of the transistors 30, 32 and 34 are respectively connected to one end of each of the fuse elements, the other end of each of which receives the power supply voltage VC. Write control inputs P1 to P3 can be applied respectively to the gates of the transistors 20, as needed. The transistors 30, 32 and 34 are selectively turned on when the control inputs P1 to P3 are not selectively supplied to the corresponding transistors 20. The level of the adjusting signal SI is determined by a ratio of the resistance of the transistor in the ON state to that of the transistor 26. As a result, the adjusting signal SI is obtained which has a voltage increased in a stepwise manner so as to correspond to 3-bit memory data in the order of "000", "001", "011" and "111" in accordance with combinations of input signals P1 to P3, as shown in FIG. 5.

FIG. 6 shows a circuit of a first embodiment in which the present invention is applied to three series-connected inverters INV1, INV2 and INV3 which have depletion type MOS transistors 41, 42 and 43 as loads and enhancement type MOS transistors 44, 45 and 46 as driver transistors, respectively. MOS transistors 47, 48 and 49 of the enhancement type or having a threshold voltage of 0 V are respectively connected between the MOS transistors 41, 42, and 43 and points of the power supply voltage VC, respectively. The gates of the MOS transistors 47, 48, and 49 are supplied with the adjusting signal SI. It is noted that the MOS transistors are of the n-channel type in the above description, but may be of the p-channel type.

The adjusting signal SI is produced by the adjusting circuit shown in FIG. 4. The level of the output voltage from the adjusting circuit is changed in correspondence with a change in the storage data of the nonvolatile memory element, as shown in FIG. 5.

In the circuit having the arrangement described above, the dimensions of the MOS transistors are selected to determine current consumption and response time of the inverters INV1, INV2 and INV3, so that currents flowing through the MOS transistor 47, 48 and 49 are controlled in accordance with the storage data of the memory element. Specifically, the dimensions of the MOS transistors 41, 42 and 43 of the inverters INV1, INV2 and INV3 and the those of the MOS transistors 44, 45 and 46 are determined so as to sufficiently charge/discharge the loads of the next stages. Furthermore, the gate voltages of the MOS transistors 47, 48 and 49 are arbitrarily changed in accordance with the data stored in the memory elements, and hence the current consumption and the response time of the semiconductor integrated circuit can be changed as needed. As a result, the response time of the circuit can be arbitrarily changed in accordance with the storage data in the memory elements.

Figure 7:
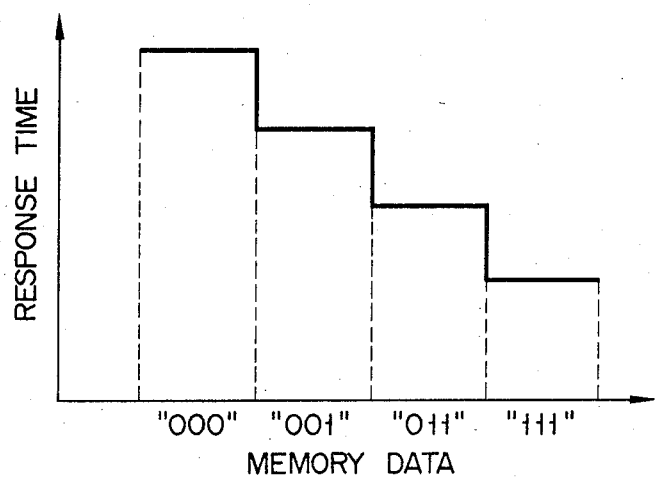
FIG. 7 is a graph showing the response time as a function of the memory data so as to explain the characteristics of the adjusting signal SI.

FIG. 7 is a graph showing the response time as a function of the memory data when a signal having the characteristics shown in FIG. 5 is supplied as the adjusting signal SI to the circuit described above.

Figure 8:
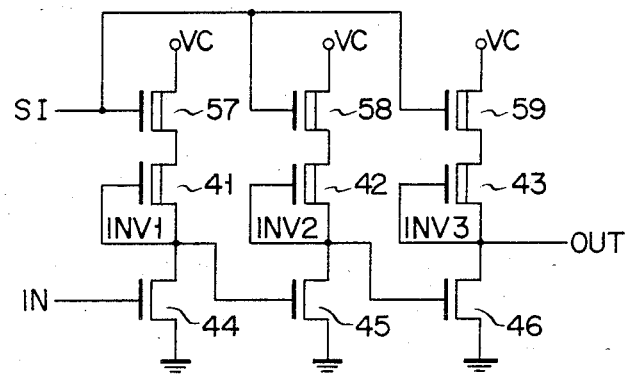
FIG. 8 is a circuit diagram of a semiconductor integrated circuit as a modification of the circuit shown in FIG. 6.

FIG. 8 is a circuit diagram of a semiconductor integrated circuit as a modification of the circuit shown in FIG. 6 in which the main semiconductor circuit 10 comprises an inverter circuit. The circuit shown in FIG. 8 is substantially the same as that shown in FIG. 6, except that depletion type MOS transistors 57, 58 and 59 are used in place of the enhancement type MOS transistors 47, 48 and 49.

FIG. 9 is a circuit diagram of a semiconductor integrated circuit according to a second embodiment of the present invention in which the main semiconductor circuit 10 comprises a buffer circuit BA. In this MOS integrated circuit, a buffer circuit BA is arranged so as to drive a circuit element which has a large capacitance.

The buffer circuit BA comprises an inverter INVa, an inverter INVb, a depletion type MOS transistor 65, and an enhancement type MOS transistor 66. The inverter INVa has a depletion type MOS transistor 61 and an enhancement type MOS transistor 62 and inverts an input signal IN. The inverter INVb has a depletion type MOS transistor 63 and an enhancement type MOS transistor 64 and inverts an output signal from the inverter INVa. The depletion type MOS transistor 65 has one end connected to a large capacitance circuit point P and receives the output signal from the inverter INVa at its gate. The enhancement type MOS transistor 66 has one end connected to the circuit point P and receives an output signal from the inverter INVb at its gate. A depletion type MOS transistor 67 and an enhancement type MOS transistor 68 are connected in series with each other between the circuit point P and the power supply voltage VC. The depletion type MOS transistor 67 receives the output signal from the inverter INVa at its gate. The enhancement type MOS transistor 68 receives the adjusting signal SI at its gate. In this case, p-channel MOS transistors may be used in place of the n-channel MOS transistors.

The response time and the current consumption of the semiconductor integrated circuit are often determined by the number of circuit points P. Even if the MOS transistors 68 are arranged only at the circuit points P, great effects can be obtained. This is because the adjusting signal SI is supplied to the gate of the MOS transistor 68 to change a charge current at the circuit point P when the input signal IN is set at logic level "0" and the MOS transistor 65 is ON. In this case, the MOS transistor 68 may be of the depletion type. Furthermore, the MOS transistor 67 may be omitted. The MOS transistor 67 may be arranged on the side of the power supply voltage VC, whereas the MOS transistor 68 may be arranged on the side of the circuit point P.

FIG. 10 shows a circuit as a modification of the circuit shown in FIG. 9. A series circuit of a depletion type MOS transistor 67a and an enhancement type MOS transistor 68a is added to the transistors 67 and 68 of the circuit shown in FIG. 9. The input signal applied to the gate of the transistor 67 is also applied to the gate of the transistor 67a, whereas an adjusting signal SII which differs from the adjusting signal SI is applied to the gate of the transistor 68a. According to the circuit shown in FIG. 10, the charge current at the circuit point P can be changed in a stepwise manner by a combination of the logic levels of the adjusting signals SI and SII. Assume that the signals of logic level "1" are supplied to the gates of the transistors 67 and 67a: (1) when the adjusting signals SI and SII are both set at logic level "0", the transistors 68 and 68a are OFF; (2) when the adjusting signal SI is set at logic level "1" and the adjusting signal SII is set at logic level "0" the transistor 68 is ON and the transistor 68a is OFF; (3) when the adjusting signal SI is set at logic level "0" and the adjusting signal SII is set at logic level "1", the transistor 68 is OFF and the transistor 68a is ON; and (4) when the adjusting signals SI and SII are both set at logic level "1", the transistors 68 and 68a are both ON.

When the transistors 67 and 67a have the same drive capacity, the charge currents at the circuit point P are the same as in cases (2) and (3). However, when the transistors 67 and 67a have different drive capacities from each other, the charge currents at the circuit point P are different as in cases (2) and (3).

Figure 11:
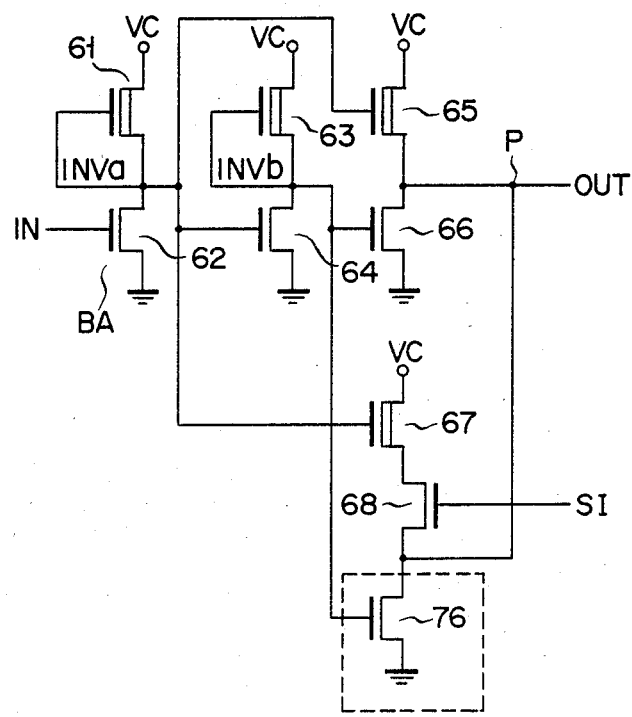

FIG. 11 shows a circuit as another modification of the circuit shown in FIG. 9. The circuit shown in FIG. 11 is substantially the same as that shown in FIG. 9, except that the MOS transistor 67 is directly connected to the power supply voltage VC and the MOS transistor 68 is arranged on the side of the circuit point P (FIG. 11), and that an enhancement type MOS transistor 76 (equivalent to the MOS transistor 66) which receives the output signal from the inverter INVb is connected between the circuit point P and the ground potential. As a result, a series circuit of the MOS transistors 67, 68 and 76 is connected in parallel with a series circuit of the MOS transistors 65 and 66 with respect to the circuit point P.

Figure 12:
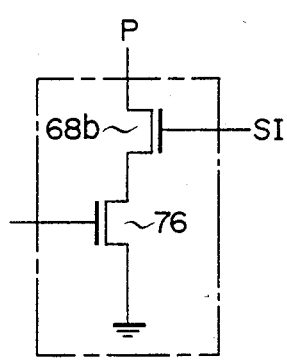
FIG. 12 is a circuit diagram of a semiconductor integrated circuit as a modification of the circuit shown in FIG. 11.

As shown in FIG. 12, an enhancement type MOS transistor 68b may be connected between the drain of the MOS transistor 76 and the circuit point P. The MOS transistor 68b has the same function as the MOS transistor 68 which receives the adjusting signal SI. The drain of the MOS transistor 68b is connected to the circuit point P, and the source thereof is connected to the drain of the MOS transistor 76. The drain of the MOS transistor 76 is thus connected to the circuit point P through the MOS transistor 68b. In a circuit having this arrangement, the discharge speed at the circuit point P can be controlled by the adjusting signal SI.

Figure 13:
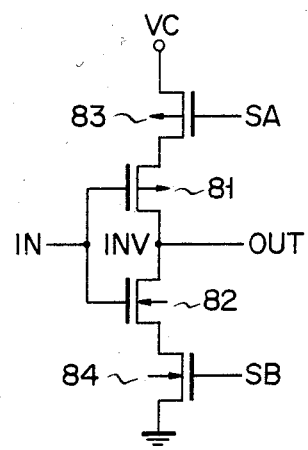
FIG. 13 is a circuit diagram of a semiconductor device according to a third embodiment of the present invention in which the main semiconductor circuit comprises a CMOS inverter circuit.
Figure 14:
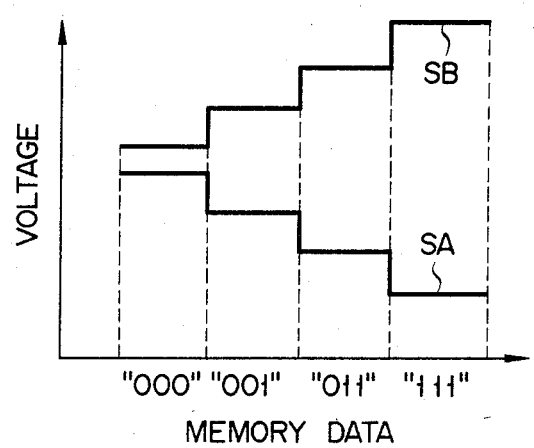
FIG. 14 is a graph showing the voltage as a function of the memory data so as to explain the characteristics of adjusting signals SA and SB.

FIG. 13 is a circuit diagram of a semiconductor integrated circuit according to a third embodiment of the present invention in which the main semiconductor circuit comprises a CMOS inverter circuit. A p-channel MOS transistor 81 and an n-channel MOS transistor 82 constitute a CMOS inverter circuit INV for inverting the input signal IN to obtain an output signal OUT. A p-channel MOS transistor 83 which receives an adjusting signal SA at its gate is connected between the p-channel MOS transistor 81 and the power supply voltage VC. An n-channel MOS transistor 84 which receives an adjusting signal SB at its gate is connected between the n-channel MOS transistor 82 and the ground potential. The adjusting signals SA and SB are shown in FIG. 14.

The adjusting signal SB is produced by the circuit shown in FIG. 4. The adjusting signal SA can be obtained in accordance with a modification of the circuit (FIG. 4) such that p-channel MOS transistors are used instead of the n-channel MOS transistors and the polarities of the power supply are inverted.

In this circuit, signals which readily turn on the MOS transistors 83 and 84 are supplied to the gates thereof in accordance with the storage data of the memory element, so that a current therethrough is increased, thus shortening the response time of the circuit as a whole.

Figure 15:
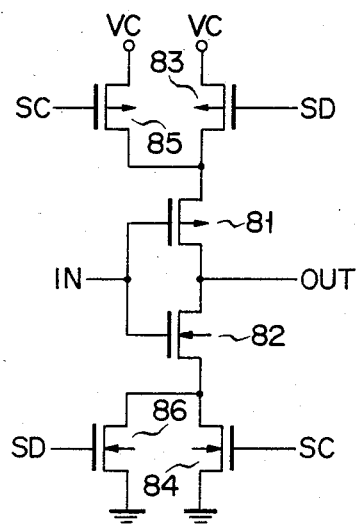
FIG. 15 is a circuit diagram of a semiconductor integrated circuit as a modification of the circuit shown in FIG. 13.

FIG. 15 shows a circuit as a modification of the circuit shown in FIG. 13. The circuit shown in FIG. 15 is substantially the same as that shown in FIG. 13, except that the p-channel MOS transistor 83 which receives an adjusting signal SD at its gate is connected parallel to a p-channel MOS transistor 85 which receives an adjusting signal SC at its gate, and that the n-channel MOS transistor 84 which receives the adjusting signal SC at its gate is connected in parallel with an n-channel MOS transistor 86 which receives the adjusting signal SD at its gate.

The adjusting signals SC and SD have the characteristics shown in FIG. 16. The adjusting signal SC goes high or low in accordance with logic level "0" or "1" of the storage data of the memory element. However, the adjusting signal SD goes low or high in accordance with logic level "0" or "1". The adjusting signal SD is produced by the circuit shown in FIG. 3, and the adjusting signal SC is obtained by inverting the adjusting signal SD.

Since the MOS transistors 83 and 84 have a different drive capacity from the MOS transistors 85 and 86, the response time can be determined due to a difference in ON times of the transistors.

In the above modification, the MOS transistors 83 and 84 and the MOS transistors 85 and 86 are selectively turned on in accordance with the storage data of the memory element, so that current compensation is effectively performed. In this case, a signal of logic level "0" (e.g., ground potential) instead of the adjusting signal SD may be applied to the gate of MOS transistor 83, and a signal of logic level "1" (e.g., power supply voltage VC) instead of the adjusting signal SC may be applied to the gate of the MOS transistor 84, so that the MOS transistors 83 and 84 may be both ON.

Figure 17:
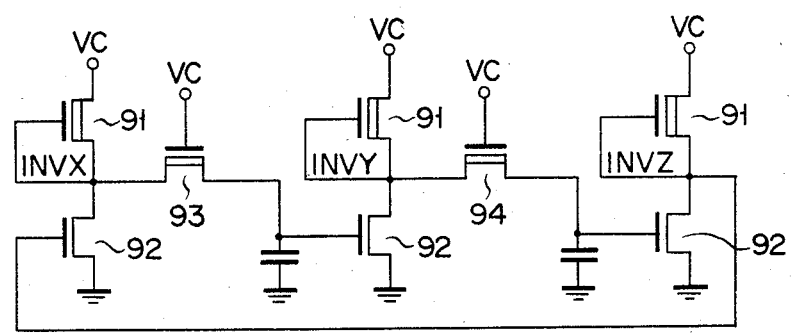
FIG. 17 is a circuit diagram of a conventional oscillator circuit.
Figure 18:
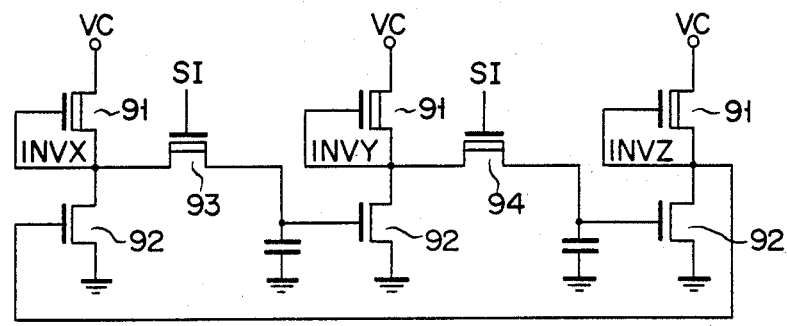
FIGS. 18 to 20 are circuit diagrams of semiconductor integrated circuits according to a fourth embodiment of the present invention in which the main semiconductor circuits comprise oscillator circuits, respectively.

A semiconductor integrated circuit of a fourth embodiment of the present invention will be described with reference to FIGS. 17 to 20 in which the main semiconductor circuit comprises an oscillator circuit. FIG. 17 is a circuit diagram of a conventional oscillator circuit which has three inverters INVX, INVY, and INVZ each having a depletion type MOS transistor 91 and an enhancement type MOS transistor 92, a depletion type MOS transistor 93 connected between the inverters INVX and INVY, and a depletion type MOS transistor 94 connected between the inverters INVY and INVZ. In the conventional circuit, a fixed bias voltage (e.g., voltage VC) is applied to the gates of the MOS transistors 93 and 94. However, an oscillation frequency cannot be changed once the integrated circuit is manufactured. However, in the oscillation circuit of the present invention, as shown in FIG. 18, the adjusting signals SI are applied to the gates of the MOS transistors 93 and 94 so as to change an oscillation frequency in accordance with the storage data of the nonvolatile memory element. When the integrated circuit is manufactured and if a change in oscillation frequency is required, the gate voltages of the MOS transistors 93 and 94, and hence the circuit constant (resistance in this case) is changed to obtain a proper oscillation frequency.

Figure 19:
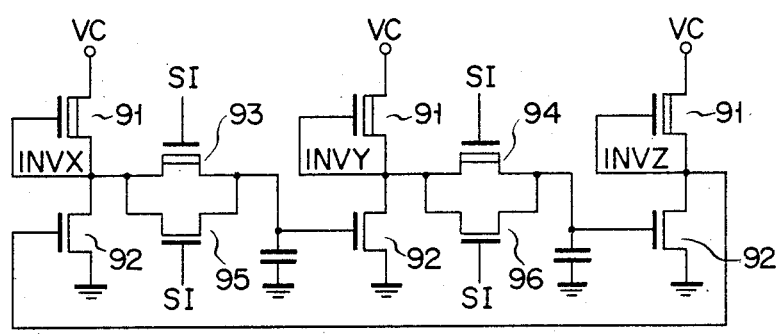

As shown in FIG. 19, enhancement type MOS transistors 95 and 96 may be connected in parallel with the MOS transistors 93 and 94, respectively. In this case, the adjusting signals SI may be applied to the gates of the MOS transistors 95 and 96.

Figure 20:
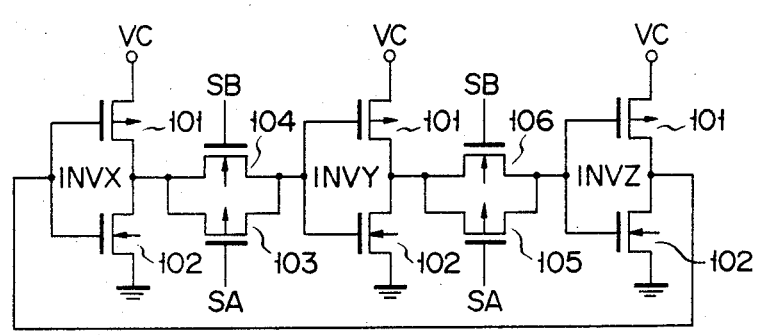

Alternatively, as shown in FIG. 20, each of the inverters INVX, INVY and INVZ may comprise a p-channel MOS transistor 101 and an n-channel MOS transistor 102. A parallel circuit of a p-channel MOS transistor 103 and an n-channel MOS transistor 104 is connected between the inverters INVX and INVY. Similarly, a parallel circuit of a p-channel MOS transistor 105 and an n-channel MOS transistor 106 is connected between the inverters INVY and INVZ. In this case, the adjusting signals SA are supplied to the gates of the MOS transistors 103 and 105, whereas the adjusting signals SB are supplied to the gates of the MOS transistors 104 and 106.

Furthermore, a parallel circuit of an enhancement type MOS transistor which receives the adjusting signal SD at its gate and an enhancement type MOS transistor which has a different gate size from the enhancement type MOS transistor described above may be connected in the circuit shown in FIG. 18, instead of the MOS transistors 93 and 94. The MOS transistors of the parallel circuit may be switched by the adjusting signals SC and SD applied to the gates thereof.

Figure 21:
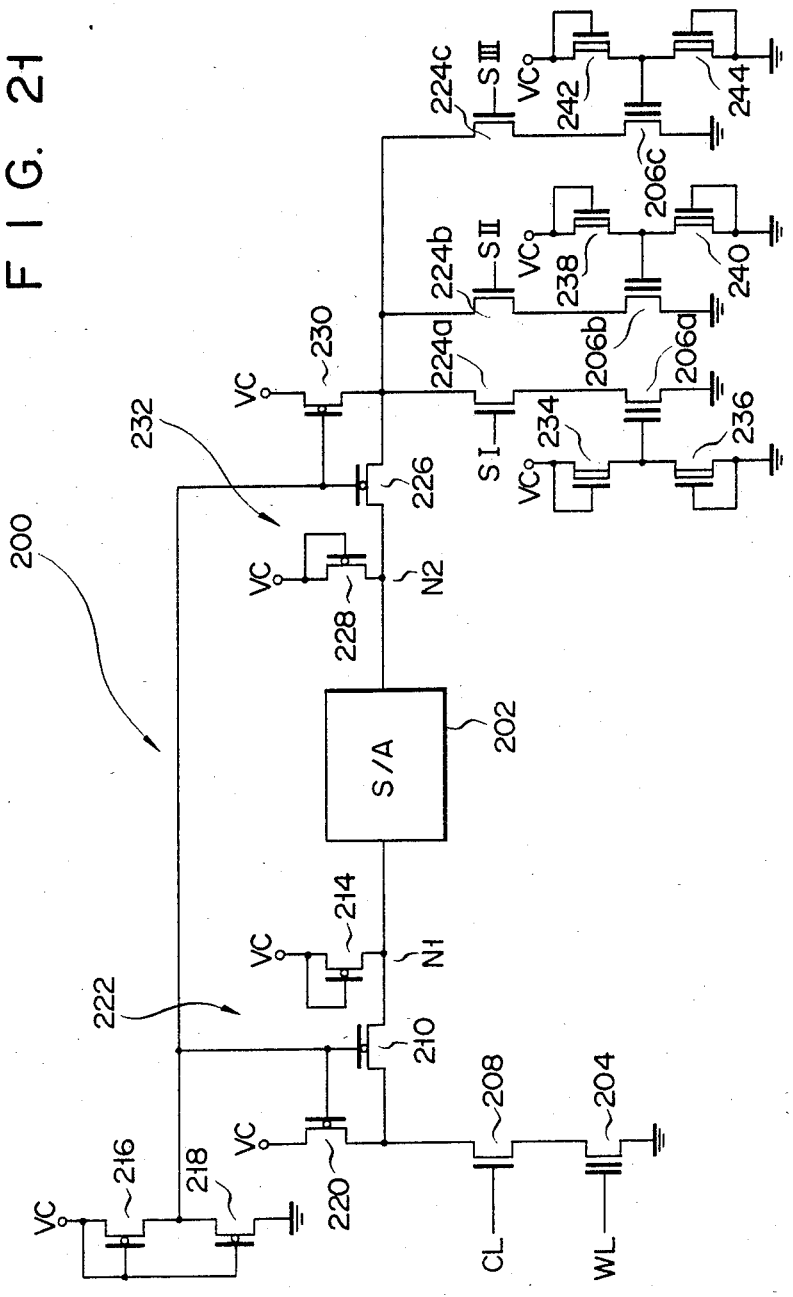
FIG. 21 is a circuit diagram of a semiconductor integrated circuit according to a fifth embodiment of the present invention in which the main semiconductor circuit comprises an erasable programmable read-only memory (EPROM)

A semiconductor integrated circuit of a fifth embodiment of the present invention will be described with reference to FIG. 21 in which the main semiconductor circuit 10 comprises an erasable programmable read-only memory (EPROM). An EPROM 200 comprises a sense amplifier 202, a memory cell transistor 204 having a double gate structure, and reference cell transistors 206a, 206b and 206c respectively having a double gate structure. The gate of the memory cell transistor 204 is connected to a word line WL. One end of the source-drain path of the memory cell transistor 204 is connected to an input end of the sense amplifier 202 through the source-drain paths of transistors 208 and 210. The MOS transistor 210 has a threshold voltage of 0 V. The gate of the MOS transistor 208 is connected to a column line CL. A power supply voltage VC is supplied, through a MOS transistor 214, to a node N1 between one end of the source-drain path of the MOS transistor 210 and the input end of the sense amplifier 202. The drain voltage of the memory cell transistor 204 is set at a predetermined value by a bias circuit 222 which comprises MOS transistors 216, 218, 220, 210 and 214. Similarly, one end of the source-drain path of the reference cell transistor 206a is connected to the reference potential input end of the sense amplifier 202 through the source-drain paths of transistors 224a and 226. One end of the source-drain path of the reference cell transistor 206b is connected to the reference voltage input end through the source-drain paths of the transistors 224b and 226. One end of the source-drain path of the reference cell transistor 206c is connected to the reference potential input end through the source-drain paths of the transistors 224c and 226. The power supply voltage VC is supplied, through the MOS transistor 228, to a node N2 between one end of the source-drain path of the MOS transistor 226 and the input end of the sense amplifier 202. The drain voltages of the memory cell transistors 206a, 206b and 206c are determined by a bias circuit 232 which comprises MOS transistors 216, 218, 230, 226 and 228. A voltage which is determined by the conductances of transistors 234 and 236 is applied to the gate of the reference cell transistor 206a. Similarly, a voltage which is determined by the conductances of transistors 238 and 240 is applied to the gate of the reference cell transistor 206b. Furthermore, a voltage which is determined by the conductances of transistors 242 and 244 is applied to the gate of the reference cell transistor 206c. The transistors 234, 238 and 242 have the same conductance, whereas the transistors 236, 240 and 244 have different conductances.

The selection signals (adjusting signals) SI, SII and SIII are supplied to the gates of the MOS transistors 224a, 224b and 224c, respectively. When the selection signal SI is applied to the MOS transistor 224a which is then ON, data from the reference cell transistor 206a is supplied to the reference potential input end of the sense amplifier 202. Therefore, when one of the reference cell transistors 206a, 206b and 206c is selected as needed, the reference signal from the sense amplifier 202 can be arbitrarily changed.

The selection signals SI, SII and SIII can be generated from the circuit 12 shown in FIG. 22. The circuit 12 comprises fuse elements 250, 252 and 254, enhancement type MOS transistors 256 to 270, and depletion type MOS transistors 272 to 284. A write control input signal P1 is supplied to the gates of the MOS transistors 256 and 262, respectively. A write control input signal P2 is supplied to the gate of the MOS transistor 268. The selection signal SI is produced at the node between the source-drain paths of the MOS transistors 260 and 276. The selection signal SII is produced at the node between the source-drain paths of the MOS transistors 264 and 280. The selection signal SIII is produced at the node between the source-drain paths of the MOS transistors 270 and 284.

If, the write control input signals P1 and P2 are kept low, the MOS transistors 256, 262 and 268 are all OFF. Therefore, the power supply voltage VC is respectively supplied to the gates of the MOS transistors 258, 264 and 270, so that the MOS transistors 258, 264 and 270 are ON. As a result, the selection signal SI goes high, whereas the selection signals SII and SIII go low (FIG. 23).

Assume that the write control input signal P1 is high and the write control input signal P2 is low. The MOS transistors 256 and 262 are ON, whereas the MOS transistor 268 is OFF. Therefore, the fuse elements 250 and 252 are disconnected, so that the MOS transistors 258 and 264 receive a voltage of 0 V at their gates through the depletion type MOS tran 272 and 278. The MOS transistors 258 and 264 are then OFF. On the other hand, the selection signal SIII is continuously applied to the gate of the MOS transistor 266. It is kept low because the write control input signal P2 is kept low. Therefore, the MOS transistor 266 is in the OFF state. Therefore, the selection signal SI goes low, whereas the selection signal SII goes high (FIG. 23).

Assume that the write control input signal P2 goes high. All the fuse elements 250, 252 and 254 are disconnected. The selection signal SIII goes high. Since the selection signal SIII is being supplied to the gate of the MOS transistor 266, the MOS transistor 266 is ON, so that the selection signal SII goes low. As a result, only the selection signal SIII goes high (FIG. 23).

FIG. 24 shows the relationship between the power supply voltage VC and the output voltages at the nodes N1 and N2. The logic level of the memory contents is determined as "1" or "0" in accordance with the fact that a voltage at the node N2 is higher or lower than a voltage at the node N1. Curves $\alpha 1$ and $\alpha 2$ which respectively indicate memory cell data "0" and memory cell data "1" are changed in accordance with the data storage of the memory cell transistor 204 or a threshold voltage thereof. The curve $\alpha 1$ has a slope which is changed when the power supply voltage VC exceeds the threshold voltage of the cell. In this case, the selection signal SI, SII or SIII can be used to select the reference cell transistor 206a, 206b or 206c so as to select an optimum reference voltage in accordance with the amount of data to be written.

Figure 25:
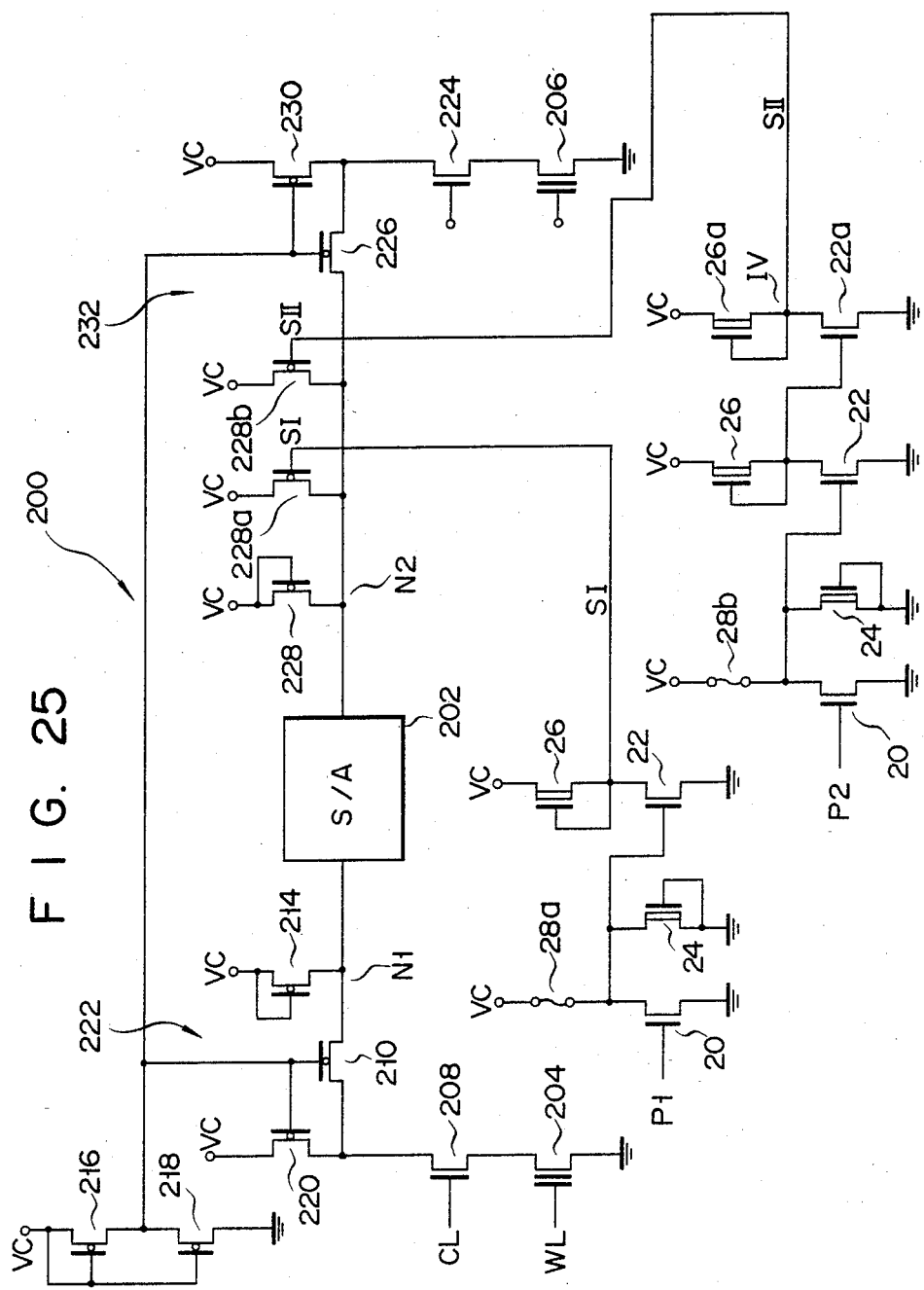
FIG. 25 is a circuit diagram of a semiconductor integrated circuit according to a sixth embodiment of the present invention in which the main semiconductor circuit comprises an erasable programmable read-only memory (EPROM)

A semiconductor integrated circuit according to a sixth embodiment of the present invention will be described with reference to FIG. 25 in which the main semiconductor circuit 10 comprises another type of erasable programmable read-only memory (EPROM). In this embodiment, a plurality of MOS transistors 228, 228a and 228b are arranged to receive the power supply voltage VC. The adjusting signal SI is supplied to the gate of the MOS transistor 228a, and the adjusting signal SII is supplied to the gate of the MOS transistor 228b. The adjusting signal SI is generated by the circuit shown in FIG. 3, and the adjusting signal SII is produced by a circuit having a circuit shown in FIG. 3 and another inverter IV consisting of MOS transistors 22a and 26a.

FIGS. 26 and 27 show changes in the adjusting signals SI and SII with respect to the write control input signals P1 and P2. When the write control input signals P1 and P2 are both low, the adjusting signal SI goes low and the adjusting signal SII goes high. When only the write control input signal P1 goes high, the fuse element 28a is disconnected. The adjusting signal SI then goes high (FIG. 26). When only the write control input signal P2 goes high, the fuse element 28b is disconnected, so that the adjusting signal SII goes low (FIG. 27).

In the circuit having the arrangement described above, when the adjusting signals SI and SII are changed, a voltage at the node N2 can be changed. Therefore, an optimum reference voltage can be set after the semiconductor device is manufactured.

Figure 29:
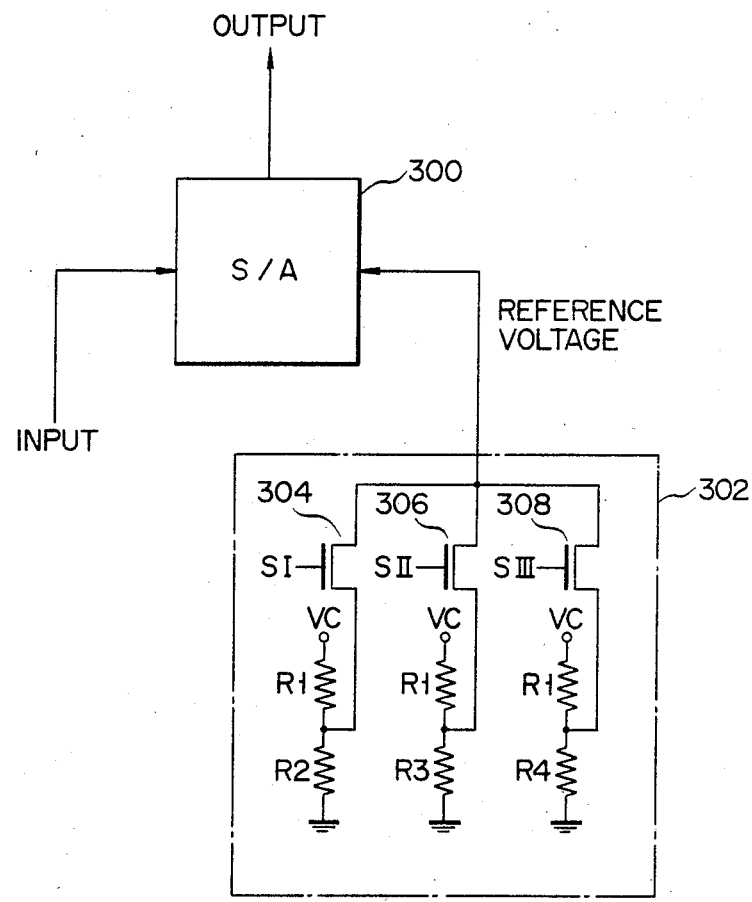
FIG. 29 is a circuit diagram of a semiconductor integrated circuit according to a seventh embodiment of the present invention in which the main semiconductor circuit comprises a sense amplifier.

A semiconductor integrated circuit according to a seventh embodiment of the present invention will be described with reference to FIG. 29 in which the main semiconductor circuit comprises a sense amplifier. A sense amplifier 300 produces an output signal after it compares the input signal and the reference voltage. When the present invention is applied to a circuit 302 for generating the reference voltage, an arbitrary reference voltage can be obtained. A voltage obtained by dividing the power supply voltage VC by resistors is selected by MOS transistors 304, 306 and 308 gates of which receive the adjusting signals SI, SII and SIII, respectively. Specifically, the MOS transistor 304 selects $VC\{R2/(R1+R2)\}$; the MOS transistor 306 selects $VC\{R3/(R1+R3)\}$; and the MOS transistor 308 selects $VC\{R4/(R1+R4)\}$. Therefore, a reference voltage can be changed even after the semiconductor integrated circuit is manufactured. It is noted that the adjusting signals SI, SII and SIII can be generated by the circuit shown in FIG. 3.

Another circuit for disconnecting the fuse element will be described with reference to FIG. 30. A pad is generally used to supply the write control input signal P in FIG. 3 from an outer signal source so as to disconnect the fuse element. However, the circuit shown in FIG. 30 uses a single pad for supplying an address input signal Ai of the address buffer or the like and for a write control input signal. Referring to FIG. 30, inverters I1 to I3 and a buffer circuit BF constitute a known address buffer. The inverter I1 produces a signal of logic level "1" when the address input signal Ai is higher than 2 V. However, the inverter I1 produces a signal of logic level "0" when the address input signal Ai is lower than 2 V. N-channel enhancement type transistors T1 to T7 and an n-channel depletion type transistor T8 are connected in series with each other. This series circuit is connected between the input end and the ground of the inverter I1. The gates of the n-channel enhancement type transistors T1 to T7 are connected to their drains, respectively. Similarly, the gate of the n-channel depletion type transistor T8 is connected to the source thereof. The drain of the transistor T8 is connected to the input end of an inverter I4. The output end of the inverter I4 is connected to the input end of an inverter I5 and to the gate of a depletion type transistor T9. The drain of the transistor T9 is connected to the power supply voltage VC, and the source thereof is connected to the drain of a depletion type transistor T10 of the inverter I5. A series circuit of enhancement type transistors T12 and T13, the gates of which are respectively connected to the corresponding drains, is connected between the drain of the transistor T10 and the input end of the inverter I1. The drain of an enhancement type transistor 20 connected in series with a fuse element 28 is connected to the drain of the transistor T13. The gate of the transistor T20 is connected to the output end of the inverter I5. An enhancement type transistor 24 having the drain and gate connected to each other is connected between the source of the transistor 20 and the power supply voltage VC.

A total of threshold voltages of the transistors T1 to T7 is set to be 15 V or higher. When the address input signal Ai is set to be 15 V or higher (e.g., 20 V), the drain of the transistor T8 is set at logic level "1". However, when the address input signal Ai is lower than 15 V, the drain of the transistor T8 is set at logic level "0". When the signal of logic level "0" appears at the drain of the transistor T8, the inverter I4 goes high, the transistor T9 is ON, and the drain of the transistor T10 is set substantially at the power supply voltage VC. The transistor T13 may not be rendered conductive unless its drain voltage is set to be $VC+2V_{TH}$ or higher ($V_{TH}$ is the threshold voltage of the enhancement type transistor). Meanwhile, the inverter I5 is kept low, so that the transistor 20 is OFF and the fuse element 28 are not disconnected. The source potential (adjusting signal SI) of the transistor 24 is kept substantially at the ground potential. On the other hand, when the address input signal Ai is 20 V the drain of the transistor T8 goes high, and the inverter I4 goes low. The enhancement type transistor T11 of the inverter I5 is turned off. At the same time, the drain of the transistor T10 is kept at a voltage ($20\ V-2V_{TH}$) which is applied as the write control input to the gate of the transistor 20 through the transistor T10. The transistor 20 is then ON, and the source voltage thereof is ($20\ V-3V_{TH}$). The fuse element 28 is then disconnected. Therefore, the source voltage (adjusting signal SI) of the transistor 24 is set at ($VC-V_{TH}$).

In the circuit having arrangement described above, a separate pad need not be used to supply the input signal to disconnect the poly-Si fuse element. Furthermore, since a high-voltage input signal is used as a power supply to disconnect the poly-Si fuse element, the fuse element can be properly disconnected.

What we claim is:

1. A semiconductor integrated circuit, comprising:
   a main semiconductor circuit having a plurality of MOS transistors of a first group arranged to perform a function at an operating speed and current consumption which is responsive to an adjusting signal; and
   circuit means for generating said adjusting signal to permanently set said main semiconductor circuit at a desired operating speed and current consumption, said circuit means including a plurality of MOS transistors of a second group and a fuse coupled together to produce said adjusting signal and to permanently alter said adjusting signal upon opening of said fuse, said circuit means further including means for selectively opening said fuse.

2. A circuit according to claim 1 wherein one of said MOS transistors of said first group has a gate coupled to receive said adjusting signal and said main semiconductor circuit comprises an inverter circuit of said MOS transistors having source-drain paths which are connected in series with each other, one end of a series arrangement of said source-drain paths being connected to a first reference power supply, and the other end thereof being connected to a second reference power supply through said one of said MOS transistors of said first group which receives the adjusting signal at a gate thereof.

3. A circuit according to claim 2, wherein said one of said MOS transistors of said first group which receives the adjusting signal at said gate thereof is of an enhancement type.

4. A circuit according to claim 2, wherein said one of said MOS transistors of said first group which receives the adjusting signal at said gate thereof is of a depletion type.

5. A semiconductor integrated circuit, comprising:
   a main semiconductor circuit having a plurality of MOS transistors of a first group arranged to perform a function at an operating speed and current consumption which is responsive to a plurality of adjusting signals; and
   circuit means for generating said plurality of adjusting signals to permanently set said main semiconductor circuit at a desired operating speed and current consumption, said circuit means including a plurality of MOS transistors of a second group and a plurality of fuses coupled to said plurality of MOS transistors to produce said adjusting signals and to permanently alter said adjusting signals upon opening of said fuses, said circuit means further including means for selectively opening said fuses.

6. A circuit according to claim 5, wherein said main semiconductor circuit comprises an inverter circuit of a CMOS structure having first and second MOS transistors of said first group, said first MOS transistor having a source-drain path, one end of which is connected to a first reference power supply through a third MOS transistor of said first group, said third MOS transistor being coupled to receive one of said adjusting signals at a gate thereof, and the other end of which is connected to one end of a source-drain path of said second MOS transistor the other end of which is connected to a second reference power supply through a source-drain path of a fourth MOS transistor of said first group, said fourth MOS transistor being coupled to receive another of said adjusting signals at a gate thereof, said third MOS transistor having the same conductivity type as a conductivity type of said first MOS transistor, and said fourth MOS transistor having the same conductivity type as a conductivity type of said second MOS transistor.

7. A circuit according to claim 6, further comprising:
   a fifth MOS transistor of said first group, a source-drain path of which is connected between said one end of the source-drain path of said first MOS transistor and said first reference power supply, said fifth MOS transistor having the same conductivity type as the conductivity type of said third MOS transistor and receiving, at a gate thereof, the same adjusting signal applied to said gate of said fourth MOS transistor; and a sixth MOS transistor of said first group, a source-drain path of which is connected between the other end of the source-drain path of said second MOS transistor and said second reference power supply, said sixth MOS transistor having the same conductivity type as the conductivity type of said fourth MOS transistor and receiving, at a gate thereof, the same adjusting signal applied to said gate of said third MOS transistor.

* * * * *